United States Patent
Karmaker

(10) Patent No.: US 10,425,071 B2
(45) Date of Patent: Sep. 24, 2019

(54) FAST SETTLING PEAK DETECTOR

(71) Applicant: QUALCOMM Incorporated, San Diego, CA (US)

(72) Inventor: Rahul Karmaker, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 137 days.

(21) Appl. No.: 15/632,238

(22) Filed: Jun. 23, 2017

(65) Prior Publication Data

US 2018/0131356 A1    May 10, 2018

Related U.S. Application Data

(60) Provisional application No. 62/419,875, filed on Nov. 9, 2016.

(51) Int. Cl.

| G05F 1/10 | (2006.01) |
| H03F 3/16 | (2006.01) |
| H03F 3/45 | (2006.01) |
| G01R 17/16 | (2006.01) |
| H03F 3/193 | (2006.01) |

(Continued)

(52) U.S. Cl.
CPC .......... H03K 5/1532 (2013.01); G01R 19/04 (2013.01); G11C 7/06 (2013.01); H03F 1/52 (2013.01); H03G 1/0088 (2013.01); H03G 3/001 (2013.01); H03G 3/3068 (2013.01); H03K 5/153 (2013.01)

(58) Field of Classification Search
CPC ...... H03K 5/1532; H03K 5/153; G01R 19/04; G11C 7/06; H03F 1/52; H03G 1/0088; H03G 3/001; H03G 3/3068

USPC .. 327/52, 53, 58, 60, 62, 63, 65–69, 71, 72, 327/74, 77–81, 88, 89, 96, 127, 246, 266, 327/274, 280, 287, 359, 560–563
See application file for complete search history.

(56) References Cited

U.S. PATENT DOCUMENTS

| 4,429,416 A | 1/1984 | Page |
| 7,356,310 B2 | 4/2008 | Rofougaran |

(Continued)

FOREIGN PATENT DOCUMENTS

EP    1526636 A1    4/2005

OTHER PUBLICATIONS

International Search Report and Written Opinion—PCT/US2017/056315—ISA/EPO—Jan. 17, 2018.

(Continued)

*Primary Examiner* — Brandon S Cole
(74) *Attorney, Agent, or Firm* — Colby Nipper/Qualcomm

(57) ABSTRACT

The present disclosure describes aspects of a fast settling peak detector. In some aspects, a peak detector circuit includes a first transistor having a gate coupled to an input of the circuit at which a signal is received and a drain coupled to a source of a second transistor. Current may flow in the first and second transistors responsive to the signal. The circuit also includes a third transistor having a gate coupled, via a signal-inverting component, to the input of the circuit and a drain coupled to a source of a fourth transistor. Through an inversion of the signal, other current flowing in the third and fourth transistor can reduce or cancel a frequency component of the current in the first and second transistors. In some cases, this precludes a need to filter the frequency component from an output of the circuit.

29 Claims, 9 Drawing Sheets

(51) Int. Cl.
*H03K 5/1532* (2006.01)
*G01R 19/04* (2006.01)
*H03G 3/00* (2006.01)
*H03K 5/153* (2006.01)
*H03G 1/00* (2006.01)
*G11C 7/06* (2006.01)
*H03F 1/52* (2006.01)
*H03G 3/30* (2006.01)

(56) References Cited

U.S. PATENT DOCUMENTS

| | | | |
|---|---|---|---|
| 7,626,777 B2 | 12/2009 | Aemireddy et al. | |
| 8,666,352 B2 | 3/2014 | Jantzi | |
| 8,948,717 B2 | 2/2015 | Winoto | |
| 2004/0198284 A1 | 10/2004 | Khorram | |
| 2006/0114033 A1* | 6/2006 | Nakasha | G11C 27/02 327/91 |
| 2006/0244516 A1* | 11/2006 | Lee | G11C 5/14 327/536 |
| 2007/0096827 A1* | 5/2007 | Nguyen | H03F 1/0205 330/295 |
| 2009/0262784 A1* | 10/2009 | Ikeda | H03D 7/1441 375/130 |
| 2010/0327976 A1* | 12/2010 | Klemens | H01L 23/645 330/277 |
| 2011/0037518 A1* | 2/2011 | Lee | H03F 1/223 330/253 |
| 2013/0342274 A1* | 12/2013 | Coban | H03F 1/223 330/254 |
| 2017/0126180 A1* | 5/2017 | Bakalski | H03F 1/0261 |

OTHER PUBLICATIONS

A digitally calibrated CMOS RMS power detector for RF automatic gain control, Jan. 2008, 6 Pages.

Design of a Novel Envelope Detector for Fast-Settling Circuits, Mar. 2013, 7 Pages.

* cited by examiner

FAST SETTLING PEAK DETECTOR

RELATED APPLICATIONS

This application claims priority to U.S. Provisional Application Ser. No. 62/419,875, filed Nov. 9, 2016, the disclosure of which is incorporated by reference herein in its entirety.

FIELD OF THE DISCLOSURE

This disclosure relates generally to peak detection circuitry, more specifically to single-ended peak detection circuits.

BACKGROUND

This description of related art is provided for the purpose of generally presenting a context for the disclosure that follows. Unless indicated otherwise herein, concepts described in this section are not prior art to this disclosure and are not admitted to be prior art by inclusion herein.

Many computing and electronic devices include a transceiver to facilitate communication over a wireless network or with other devices. These transceivers often use automatic gain control (AGC) to control amplification of received radio frequency (RF) signals, the power of which can vary due to many factors, such as transmitter proximity, multipath propagation, signal fading, and the like. To determine an appropriate amount of gain to apply to the RF signals, AGC circuits sample signal strength or amplitude of the RF signals with a peak detector. Most peak detectors, however, generate an output that not only indicates the amplitude of the RF signal of interest, but also includes a fundamental frequency and other harmonics of the RF signal.

To reject the fundamental frequency and other harmonics, which are often larger than the indication of the amplitude for the RF signal of interest, peak detectors often include a capacitor to filter out the fundamental frequency and other harmonics. This filter capacitor, however, slows operation of the peak detector and can prevent the AGC circuit from quickly responding to changes in RF signal amplitude. Alternatively, some peak detectors are implemented as fully differential circuits to address the fundamental frequency issue, but these differential circuits require a tail current source that reduces the voltage overhead of the circuit, increases circuit complexity, and consumes additional power.

SUMMARY

In some aspects of a fast settling peak detector, a peak detector circuit includes a first transistor having a gate coupled to an input of the circuit at which a signal is received and a drain coupled to a source of a second transistor. The circuit also includes a third transistor having a gate coupled, via a signal-inverting component, to the input of the circuit and a drain coupled to a source of a fourth transistor. A bias circuit is coupled to the gate of the first transistor to bias the first transistor of the peak detector circuit. A voltage rail is coupled, via a resistor, to an output of the circuit, which is a node to which respective drains of the second and fourth transistors are coupled.

In other aspects, a peak detector circuit includes a first transistor having a gate coupled to an input of the circuit at which a signal is received and a drain coupled to a source of a second transistor. The circuit also includes a third transistor having a gate coupled, via phase-shift circuitry, to the input of the circuit and a drain coupled to a source of a fourth transistor. A bias circuit is coupled to the gate of the first transistor to bias the first transistor of the peak detector circuit. A resistor is coupled from a voltage rail to an output of the circuit, which is a node to which respective drains of the second and fourth transistors are coupled.

In yet other aspects, a method of circuit operation includes receiving a signal for peak detection at an input of the circuit. The signal is applied to a gate of a first transistor having a drain coupled to a source of a second transistor. The method also inverts the signal to provide an inverted signal, which is applied to a third transistor having a drain coupled to a source of a fourth transistor. A frequency component of current flowing in the first and second transistors is reduced with other current flowing in the third and fourth transistors based on the inverted signal. The method then provides an output signal based on the current flowing in the first and second transistors and the other current flowing in the third and fourth transistors.

In other aspects, a circuit for peak detection comprises an input configured to receive a signal and a first pair of transistors in which current flows responsive to the signal. The circuit also includes signal inversion means for providing, based on the signal, an inverted signal and a second pair of transistors in which other current flows responsive to the inverted signal. Means of the circuit for reducing a frequency component reduce a frequency component of the current flowing in the first pair of transistors with a portion of the other current flowing in the second pair of transistors. The circuit also includes an output configured to generate an output signal based on the current flowing in the first pair of transistors and the other current flowing in the second pair of transistors.

The foregoing summary is provided to briefly introduce some of the aspects described herein. This summary is not intended to identify key or essential features of these or other aspects that are further described throughout the disclosure.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
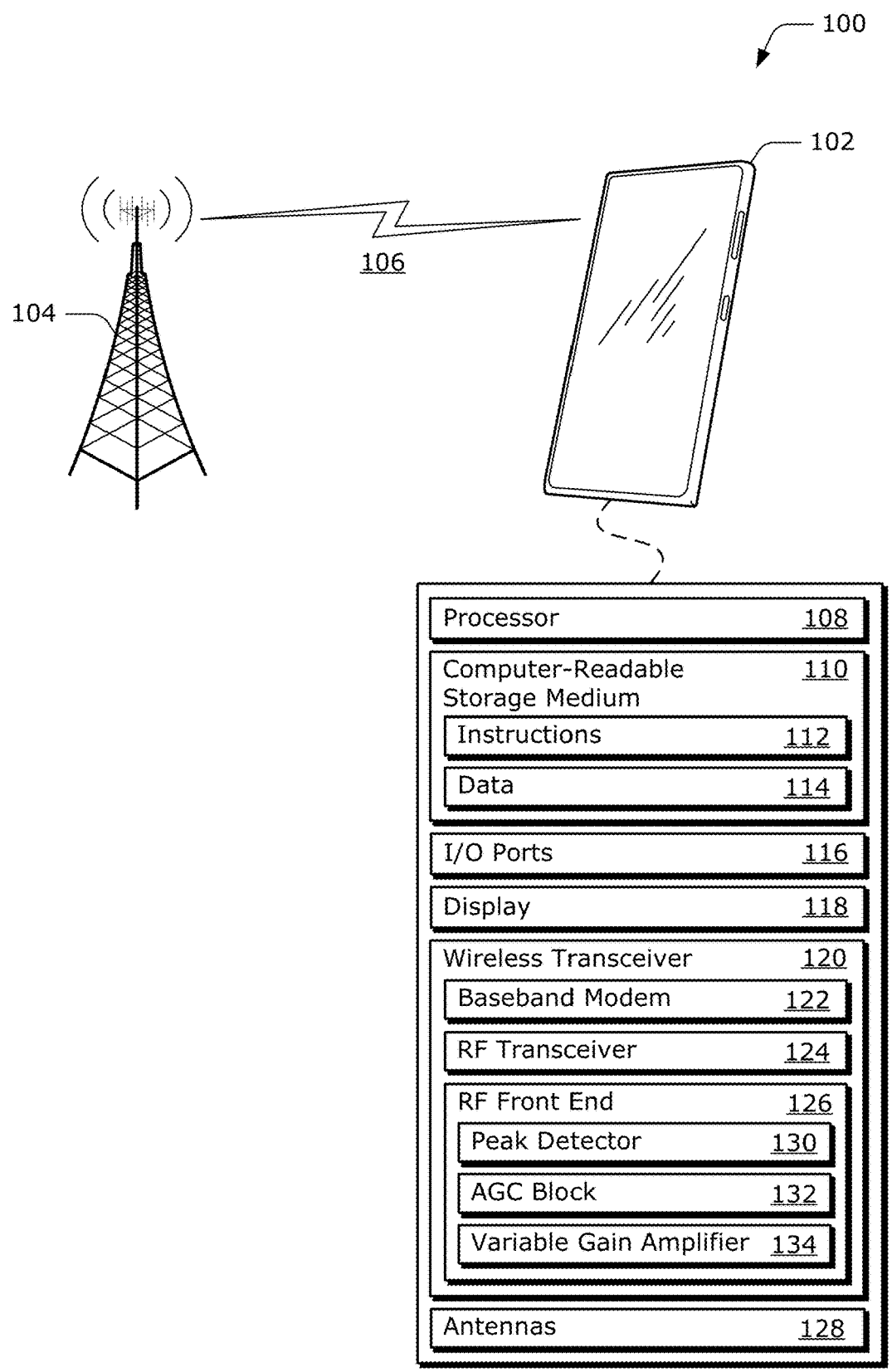
FIG. 1 illustrates an example environment that includes a computing device capable of wireless communication.

Conventionally implemented peak detectors, such as single-ended or pseudo-differential squarer circuits, typically detect not only a peak amplitude of a signal of interest, but also spectral components of the signal, such as a fundamental frequency or fundamental tone of a received signal (e.g., RF signal). In terms of signal spectrum, peak detectors typically provide an indication of peak amplitude for the signal of interest as a direct-current (DC) or near-DC term, while a fundamental tone of the RF signal and other harmonics reside at higher frequencies (e.g., above 500 MHz) in an output signal. Because the fundamental frequency components (or tones) are often larger than the desired indication of peak signal amplitude, a capacitor is used to implement a low-pass filter by which the fundamental frequency and higher-frequency harmonics are rejected or removed from an output signal of the peak detector.

Placing a filter capacitor at the output of the peak detector, however, reduces responsiveness and increases settling times of the peak detector. For example, an RC time constant associated with the filter capacitor may govern an amount of time that the output signal of the peak detector consumes to settle or accurately reflect an amplitude or peak amplitude of an input signal. For high frequency signals with short waveform periods, such as RF signals, this increase in peak detector settling time can reduce performance of AGC circuits that rely on peak detection to adjust amplification gain in a receive chain of a transceiver. In alternate implementations, such as fully differential peak detectors, the fundamental frequency components may not appear, but these circuits require increased voltage overhead to accommodate an additional tail current source. Thus, conventionally implemented peak detectors are too slow for modern wireless technologies or require additional voltage overhead for reliable operation, which increases chip-wide power consumption.

This disclosure describes aspects of a fast settling peak detector. Apparatuses and techniques described herein may implement a cancellation path or cancellation branch that generates current to cancel (or reduce) a fundamental frequency component of a signal received for peak detection. An amplitude of the reduced or cancelled fundamental frequency component is typically much lower than a DC or near-DC indication of peak amplitude for the signal of interest. This may preclude the need to reject or filter for the fundamental frequency component at an output of the circuit, thereby enabling a reduction in filtering capacitance at the output of the peak detector. For example, cancelling (or reducing) a fundamental frequency component of approximately 1 GHz may permit a cutoff of a low-pass filter at the output of the peak detector to be shifted higher to a next harmonic of approximately 2 GHz. By so doing, the filtering capacitance can reduced by about half from a typical amount of capacitance implemented by a traditional single-ended peak detector. Through a corresponding reduction of RC time constant, this reduction in capacitance results in a peak detector that can settle approximately twice as fast as a conventionally implemented single-ended peak detector.

In some aspects of a fast settling peak detector, a peak detector circuit includes a first transistor having a gate coupled to an input of the circuit at which a signal is received and a drain coupled to a source of a second transistor. Current may flow in the first and second transistors responsive to the signal received at the input of the circuit. The circuit also includes a third transistor having a gate coupled, via a signal-inverting component, to the input of the circuit and a drain coupled to a source of a fourth transistor. Through an inversion of the signal, other current flowing in the third and fourth transistors can cancel (or reduce) a frequency component (e.g., fundamental RF tone) of the current in the first and second transistors. An amplitude of the cancelled frequency component may be reduced such that the cancelled frequency component no longer dominates a desired low frequency component of the circuit's output signal generated based on the current and the other current. This in turn enables capacitance in output filtering of the peak detector to be reduced, which decreases settling times and improves responsiveness of the peak detector circuit.

These and other aspects of a fast settling peak detector are described below in the context of an example environment, example peak detector circuits, and techniques. Any reference made with respect to the example environment or circuits, or elements thereof, is by way of example only and is not intended to limit any of the aspects described herein.

Example Environment

FIG. 1 illustrates an example environment 100, which includes a computing device 102 that communicates with a base station 104 through a wireless communication link 106 (wireless link 106). In this example, the computing device 102 is implemented as a smart phone. Although not shown, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and the like.

The base station 104 communicates with the computing device 102 via the wireless link 106, which may be implemented as any suitable type of wireless link. Although shown as a base station, the base station 104 may represent or be implemented as another device, such as a satellite, cable television head-end, terrestrial television broadcast tower, access point, peer-to-peer device, mesh network node, fiber optic line, and the like. Therefore, the computing device 102 may communicate with the base station 104 or another device, via a wired connection, wireless connection, or a combination thereof.

The wireless link 106 includes a downlink of data and control information communicated from the base station 104 to the computing device 102 and an uplink of other data and control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and the like.

The computing device 102 includes a processor 108 and computer-readable storage medium 110 (CRM 110). The processor 108 may include any type of processor, such as an application processor or multi-core processor, configured to execute processor-executable code stored by the computer-readable storage medium 110. The CRM 110 may include any suitable type of data storage media, such as volatile memory (e.g., random access memory (RAM)), non-volatile memory (e.g., Flash memory), optical media, magnetic media (e.g., disk or tape), and the like. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and the like. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment, the wireless transceiver 120 enables the computing device 102 to communicate with the base station 104 and networks connected therewith.

The wireless transceiver 120 includes a baseband modem 122, radio frequency (RF) transceiver 124, and RF front end 126 to process data and/or signals associated with communicating data of the computing device 102 over antennas 128. The baseband modem 122 may be implemented as a system-on-chip (SoC) that provides a digital communication interface for data, voice, messaging, and other applications of the computing device 102. The baseband modem 122 may also include baseband circuitry to perform high-rate sampling processes that can include analog-to-digital conversion, digital-to-analog conversion, gain correction, skew correction, frequency translation, and the like.

The RF transceiver 124 includes circuitry and logic for frequency translation, which may be an up-conversion or down-conversion, performed in a single conversion, or through a plurality of conversion steps. In some cases, components of the RF transceiver 124 are implemented as separate receiver and transceiver entities. The RF transceiver 124 may include logic to perform in-phase/quadrature (I/Q) operations, such as synthesis, encoding, modulation, decoding, demodulation, and the like. In some cases, the RF transceiver 124 is implemented with multiple or different sections to implement respective receiving and transmitting operations (e.g., transmit and receive chains).

The RF front end 126 may include filters, switches, and amplifiers for conditioning signals received via the antennas 128 or signals to be transmitted via the antennas 128. In this particular example, the RF front end 126 includes a fast settling peak detector 130 (peak detector 130), automatic gain control block 132 (AGC block 132), and a variable gain amplifier 134. The implementation and use of these entities vary and is described further herein.

Figure 2:
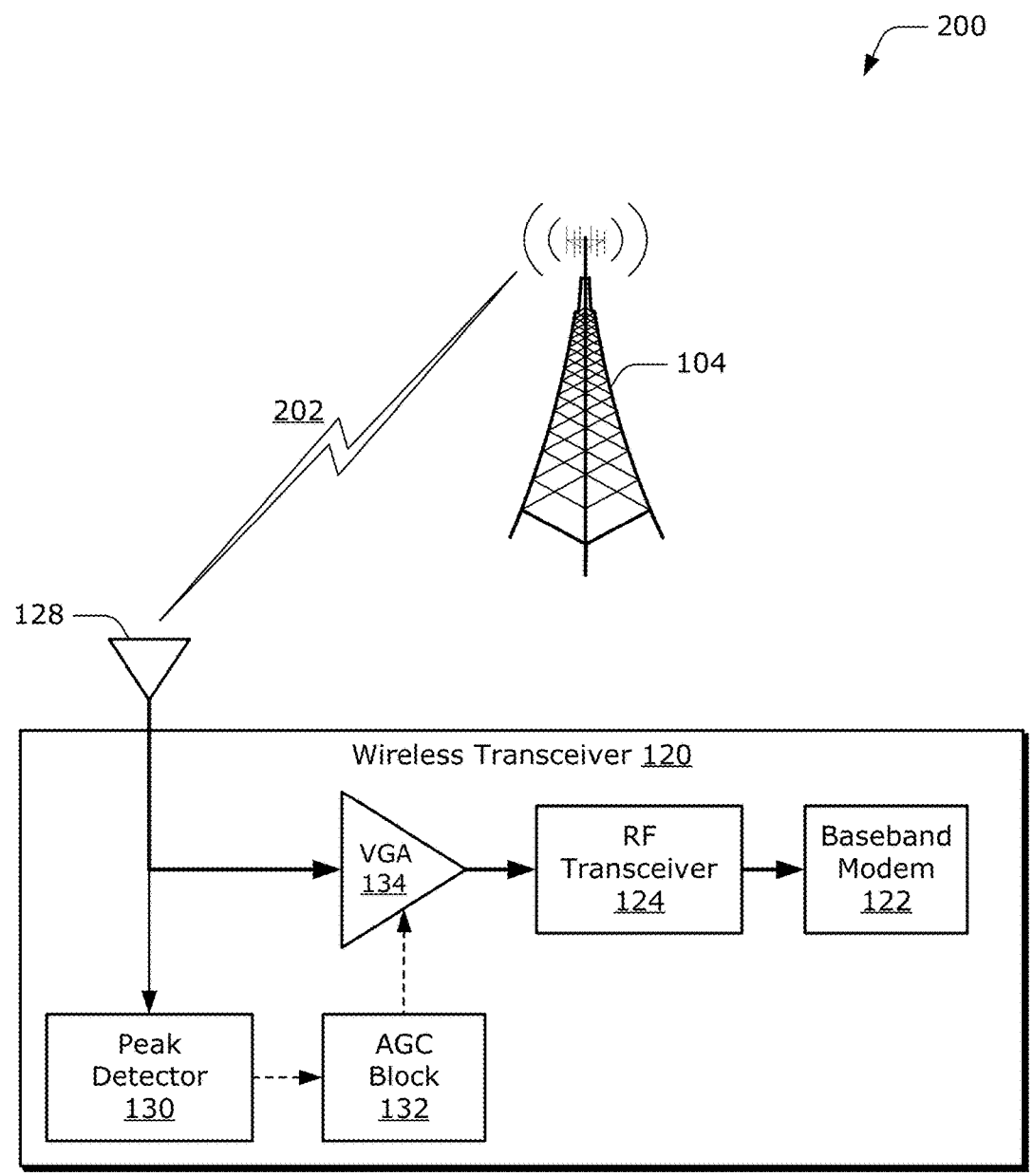
FIG. 2 illustrates an example configuration of the wireless transceiver shown in FIG. 1.

FIG. 2 illustrates an example configuration of the wireless transceiver 120 generally at 200. In this particular example, the wireless transceiver 120 is configured to receive, via antennas 128, an RF signal 202 from the base station 104. The RF signal 202 may be communicated in accordance with any suitable communication protocol or standard, and may represent a downlink portion of the wireless link 106 as described with reference to FIG. 1.

The antennas 128 are connected to the peak detector 130 and variable gain amplifier 134 (VGA 134), which is configured to amplify received signals prior to demodulation by the RF transceiver 124. In some cases, increasing or reducing amplification of received RF signals can ensure that an amplitude or power of the signals satisfy input specifications of the RF transceiver 124. In such cases, this may be effective to sufficiently amplify low-power signals for subsequent demodulation or prevent high-power signals from overloading the RF transceiver 124.

In some aspects, the peak detector 130 determines a peak amplitude of the received RF signal 202. The peak detector 130 can then provide an indication of the peak amplitude to the AGC block 132, which in turn configures or adjusts a gain of the variable gain amplifier 134. Although shown as being separate from the RF transceiver 124 and the baseband modem 122, the AGC block 132 may be implemented in whole or part by either of these or other entities of the wireless transceiver 120. After amplification, the variable gain amplifier 134 sends the received RF signals 202 to the RF transceiver 124 and baseband modem 122 for further demodulation and/or processing.

Example Fast Settling Peak Detector Circuit

Figure 3A:
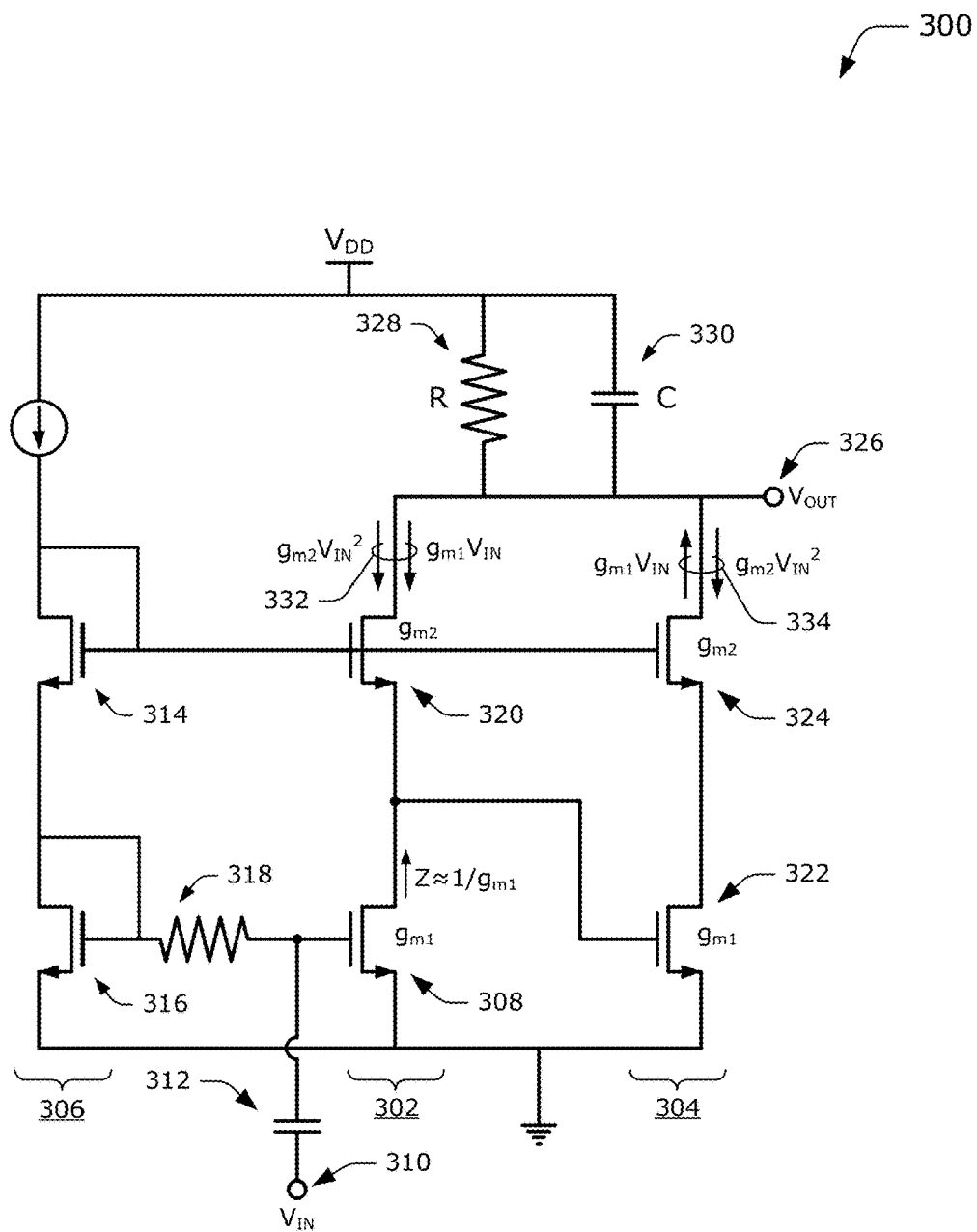
FIG. 3a illustrates an example circuit for implementing a fast settling peak detector with a transistor configured as a signal-inverting component.

FIG. 3a illustrates an example fast settling peak detector circuit 300, which is configured as a single-ended peak detector. Although described in reference to a single-ended circuit architecture, the aspects and techniques herein may be applied to other architectures, such as differential or pseudo-differential circuits. Further, signal- or current-carrying structures of the circuits may be implemented as any suitable type of conductor, such as wires, printed-circuit board (PCB) traces, etched metal layers, contacts, nets, paths, rails, and the like. The use of these terms is not meant to limit configurations of any circuit, but to provide context for describing the circuits of the accompanying figures.

The fast settling peak detector circuit 300 includes a first pair of transistors 302, a second pair of transistors 304, which may be referred to as a cancellation branch or cancellation path, and bias circuitry 306. Alternately or additionally, the second pair of transistors 304 may be referred to as a frequency component reduction branch or frequency component reduction path. In some cases, the first pair of transistors 302 or the second pair of transistors 304 are referred to as a cascode or cascode amplifier. Alternately or additionally, respective transistors of either transistor pair may be implemented as any suitable type of amplifier, amplifier stage, gain stage, cascode stage, and so on. Further, although shown as being implemented with N-channel metal-oxide-semiconductor field-effect transistors (MOSFETs or N-FETs), circuit portions, biasing, amplifiers, or aspects described herein may also be implemented with other transistor types or circuit topologies. For example, a transistor or amplifier may be implemented with a bipolar junction transistor (BJT) or P-channel MOSFET (P-FET), such as in a circuit with a reversed power rails, inverted control signal (or non-inverted signal), a current sink, or complimentary transistor types (e.g., P-FETs).

The first pair of transistors 302 includes a first transistor 308, which may be configured as a common-source amplifier, that has a gate coupled to an input 310 of the circuit. The gate of the first transistor 308 may be coupled to the input 310 via a capacitor 312 to block low frequency components of a received signal. In some cases, the first transistor 308 is referred to as a input device or a input stage of a cascode amplifier formed by the first pair of transistors 302. A source of the first transistor 308 may be connected to ground or another potential that is capable of sinking current. As shown in FIG. 3a, an impedance Z of the first transistor 308 may be equal or approximate to a reciprocal of the first transistor's transconductance $g_{m1}$ ($Z \approx 1/g_{m1}$).

The bias circuitry 306 includes two transistors 314 and 316 (e.g., gate-drain coupled N-FETs) that are configured as a current source or portion of a current mirror for biasing the first transistor 308. The bias circuitry may also include a resistor 318 that is coupled between the gate of the transistor 316 and the gate of the first transistor 308 of the first pair of transistors 302. Alternately, the gate of the transistor 316 can be directly coupled or connected to the gate of the transistor 308. Although shown as two transistors 314 and 316, any suitable configuration of bias circuitry may be used to bias other devices of the fast settling peak detector circuit 300. For example, the bias circuitry 306 can be implemented in whole or part as a current source, simple current mirror, Wilson current mirror, cascode current mirror, multiple-cascode current mirror, and so on.

A second transistor 320 of the first pair of transistors 302 has a source that is coupled to a drain of the first transistor 308. In some cases, the second transistor 320 is referred to as a cascode device or cascode stage of the cascode amplifier formed by the first pair of transistors 302. The second transistor 320 may be configured as a common-gate amplifier with a gate being coupled to a drain and gate of the transistor 314 of the bias circuitry 306. Accordingly, the bias circuitry 306 may provide bias voltage directly or indirectly (not shown) to the gate of the second transistor 320. Alternately, the gate of the second transistor 320 can be connected to another source of bias voltage, bias current, or a reference voltage.

The second pair of transistors 304 includes a third transistor 322 and fourth transistor 324 of the circuit 300, which may be configured as a common-source amplifier and common-gate amplifier, respectively. In some cases, the second pair of transistors 304 is configured as a cascode amplifier with a drain of the third transistor 322 being coupled to a source of the fourth transistor 324. In such cases, the third transistor 322 may be referred to as a input device or input stage and the fourth transistor 324 may be referred to a cascode device or cascode stage of the cascode amplifier. In this example, a gate of the fourth transistor 324 is coupled to the gate of the transistor 314 of the bias circuitry 306, which may provide bias voltage directly or indirectly (not shown) to the fourth transistor 324. The gate of the fourth transistor 324 may also be coupled to the gate of the second transistor 320 of the first pair of transistors 302. Alternately or additionally, the gate of the fourth transistor 324 may be connected to another source of bias voltage, bias current, or a reference voltage.

An output 326 of the circuit includes a node to which respective drains of the second transistor 320 and the fourth transistor 324 are coupled. The output 326 of the circuit is also coupled to a voltage rail VDD via a resistor 328, through which the first pair of transistors 302 and second pair of transistors 304 can draw current. In some cases, an output signal is generated at the output 326 based on respective amounts of current drawn through the resistor 328 by the first pair of transistors 302 and second pair of transistors 304. A resistance value of the resistor 328 may include any suitable resistance, such as between 75 ohms and 125 ohms. Alternately or additionally, a capacitor 330 can be connected in parallel with the resistor 328 to form a resistor-capacitor (RC) filter at the output of the circuit. A capacitance value of the capacitor 330 may include any suitable capacitance, such as between 40 femtofarads and 90 femtofarads. Respective values of the resistor 328 and capacitor 330 may also be selected to reject or filter harmonic frequencies (e.g., those above a fundamental tone) from the output signal of the peak detector circuit.

As noted, an output signal may be generated at the output 326 of the circuit 300 based on current flowing through the first pair of transistors 302 and second pair of transistors 304. Current may flow in the first pair of transistors 302 responsive to a signal received at an input of the circuit. In some cases, the second pair of transistors 304 is implemented as a cancellation branch or cancellation path that provides other current effective to cancel or reduce an amplitude of a frequency component of the current flowing in the first pair of transistors 302. In this example, the first transistor 308 is implemented as a signal-inverting component having a drain that is coupled to the gate of the third transistor 322. By so doing, the second pair of transistors 304 can be configured as the cancellation branch of the peak detector circuit 300. In particular, the first transistor 308 may invert, or provide an inverted instance of, a signal received at the input 310 of the circuit and apply the inverted signal to the gate of the third transistor 322. Responsive to the inverted signal applied to the gate of the third transistor 322, other current may flow in the second pair of transistors 304.

Generally, a signal applied to the gate of the first transistor 308 controls current that flows in the first pair of transistors 302. Similarly, another signal applied to the gate of the third transistor 322 controls other current that flows in the second pair of transistors 304. Applying a signal to the gate of the first transistor 308 and an inverted version of that signal to the gate of the third transistor 322 can be effective to cause a portion of the other current in the second pair of transistors 304 to flow in a direction opposite to that of the current flowing in the first pair of transistors 302.

With reference to FIG. 3a, an example of current flow is shown with respect to first order and second order circuit gain provided by each of the first and second pairs of transistors. Here, assume that the first order circuit gain is largely dependent on transconductance $g_{m1}$ and impedance of the first transistor 308 and third transistor 322 of the circuit. As shown in FIG. 3a and based on the first order circuit gain, a portion of current 332 flowing in the first pair of transistors 302 ($g_{m1}V_{IN}$) flows in a direction opposite to another portion of other current 334 flowing in the second pair of transistors 304 ($g_{m1}V_{IN}$). This portion of the other current 334 flowing in the opposite direction through the cancellation branch (e.g., pair of transistors 304) can cancel or reduce frequency components of the current flowing in the first pair of transistors. In particular, the other current in the cancellation branch may cancel non-squared frequency components of the current in the first transistor pair 302, such as a fundamental tone or fundamental frequency of an input signal. Cancelling or reducing the frequency components in the current effectively reduces a contribution of these frequency components at the output of the circuit.

Cancelling or reducing current associated with the first order circuit gain results in an overall circuit gain that includes terms of the second order circuit gain as shown in equation 1.

$$V_{OUT} = \frac{2g_{m2}V_{IN}^2 R}{(1+sRC)} \qquad \text{Equation 1}$$

As shown in FIG. 3a, the second order terms of the current 332 and the other current 334 generally flow in a same direction, with a magnitude based on respective transconductance $gm_2$ of the second transistor 320 and fourth transistor 324. The direction of flow of the other current (e.g., current 334) may be attributed to the squaring nature of the second order circuit gain which, unlike the first order circuit gain, generates current flow in the cancellation branch in a same direction (with reference to current 332) based on the inverted signal applied the gate of the transistor 322 (squaring a negative results in a positive). As such, an output signal generated at the output 326 of the circuit may comprise a sum of the current 332 and the other current 334 ($2 \times gm_2 V_{IN}^2$) multiplied by an output impedance of the circuit (R/(1+sRC)). This squaring-based circuit gain may provide, at the output 326 of the circuit, a signal that indicates peak amplitude of an input signal as a DC or near-DC term.

With a fundamental frequency component cancelled by the cancellation branch, the DC or near-DC term component of the output signal can be provided with less filtering than a traditional singled-ended peak detector. For example, a capacitance value of a filter capacitor at the output of the peak detector circuit (e.g., capacitor 330) can be reduced to reject or filter out second and higher order harmonics of an input signal. In some cases, the capacitance value is reduced by approximately half (e.g., to between 40 femtofarads and 90 femtofarads) from a capacitance value employed by a conventional peak detector to reject the higher frequency components. Reducing the capacitance (e.g., capacitor 330) may also decrease settling time of the peak detector circuit by approximately half compared to that of a conventional peak detector due to a corresponding reduction of an RC time constant of the filter. In such cases, an output signal of the peak detector circuit may settle or accurately reflect (e.g., within a 10% margin) an amplitude of an input signal in a duration of time that ranges from 10 nanoseconds to 90 nanoseconds. Here, note that VDD may also be configured to enable operation of the circuit 300 without a tail current source, and thus may be approximately 1.1 volts or lower. As such, the fast settling peak detector circuit 300 can be implemented with less voltage headroom than other circuit types, such as differential circuits that require a tail current source.

Figure 3B:
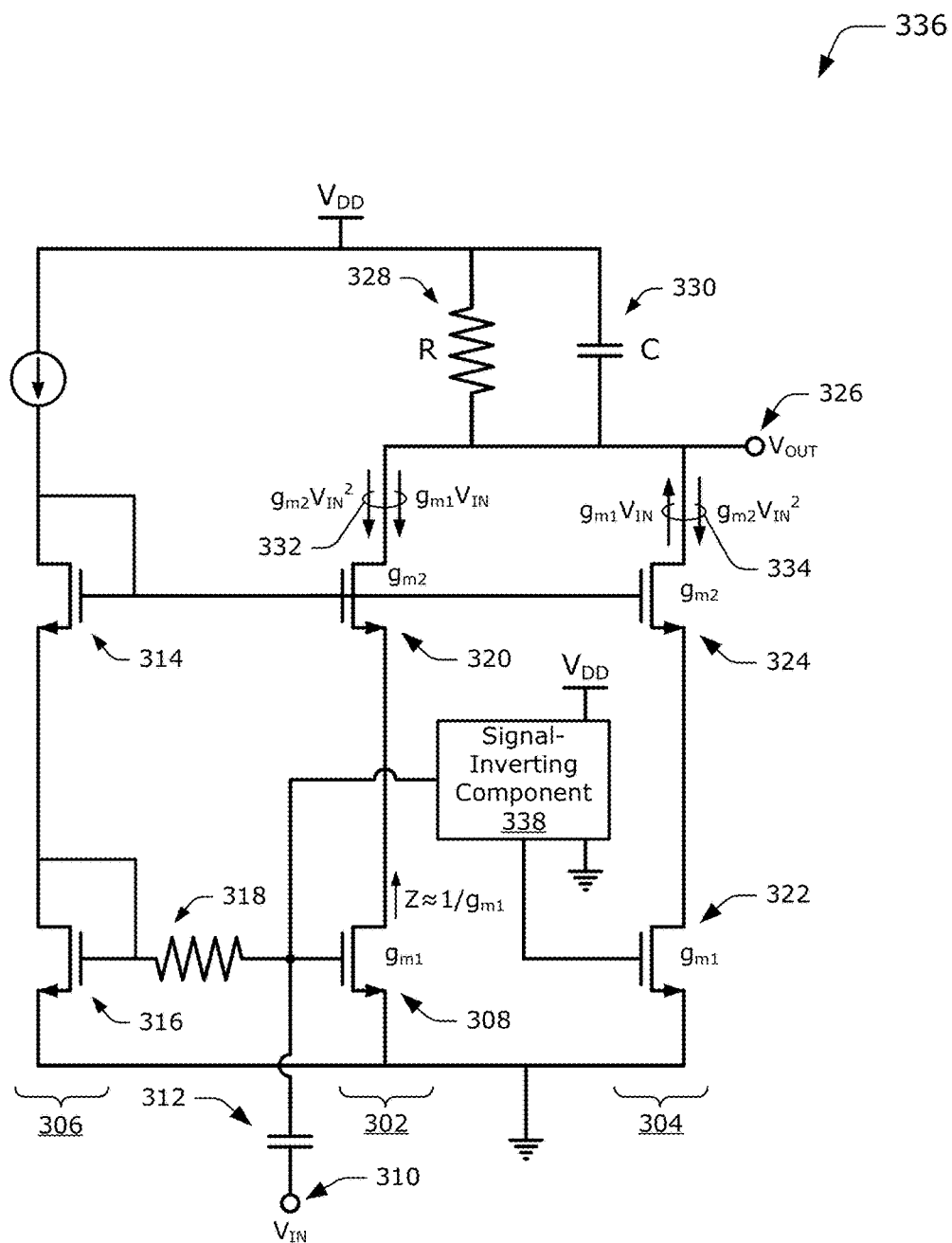
FIG. 3b illustrates an example circuit for implementing a fast settling peak detector with a signal-inverting component.

In some aspects, signal inversion for a fast settling peak detector circuit may be provided by a component other than the first transistor 308 of the circuit. By way of example, consider FIG. 3b in which another fast settling peak detector circuit is shown generally at 336. For brevity, like components of the peak detector circuit 336 may be configured similar to corresponding components of the peak detector circuit 300 of FIG. 3a. In this example, the peak detector circuit 336 includes a signal-inverting component 338 coupled between the input 310 of the circuit and a gate of the third transistor 322. This may be effective to configure the second pair of transistors 304 as a cancellation branch for the peak detector circuit 336.

Similar to the first transistor 302 of the peak detector circuit 300, the signal-inverting component 338 may invert, or provide an inverted instance of, a signal that is received at the input 310 and apply the inverted signal to the gate of the third transistor 322 of the second pair of transistors 304. The signal-inverting component 338 can be implemented using any suitable type of component, such as an operational-amplifier, transistor, logic gate (e.g., inverter), and the like. Alternately or additionally, the signal-inverting component 338 may receive operational power from a voltage rail (e.g., VDD) and be referenced to a lower potential, such as ground, to facilitate operation in the peak detector circuit 336.

As described with reference to FIG. 3a, applying a signal to the gate of the first transistor 308 and an inverted version of that signal to the gate of the third transistor 322 can be effective to cause a portion of the other current in the second pair of transistors 304 to flow in a direction opposite to that of the current flowing in the first pair of transistors 302. Thus, the inverted signal applied to the gate of the third transistor 322 can cause other current to flow in the cancellation branch that cancels non-squared frequency components of the current in the first transistor pair 302, such as a fundamental tone or fundamental frequency of an input signal. With a fundamental frequency component cancelled by the cancellation branch, the DC or near-DC term component of the output signal can be provided at the output 326 of the circuit 336 with less filtering than a traditional single-ended peak detector as described herein.

Figure 4:
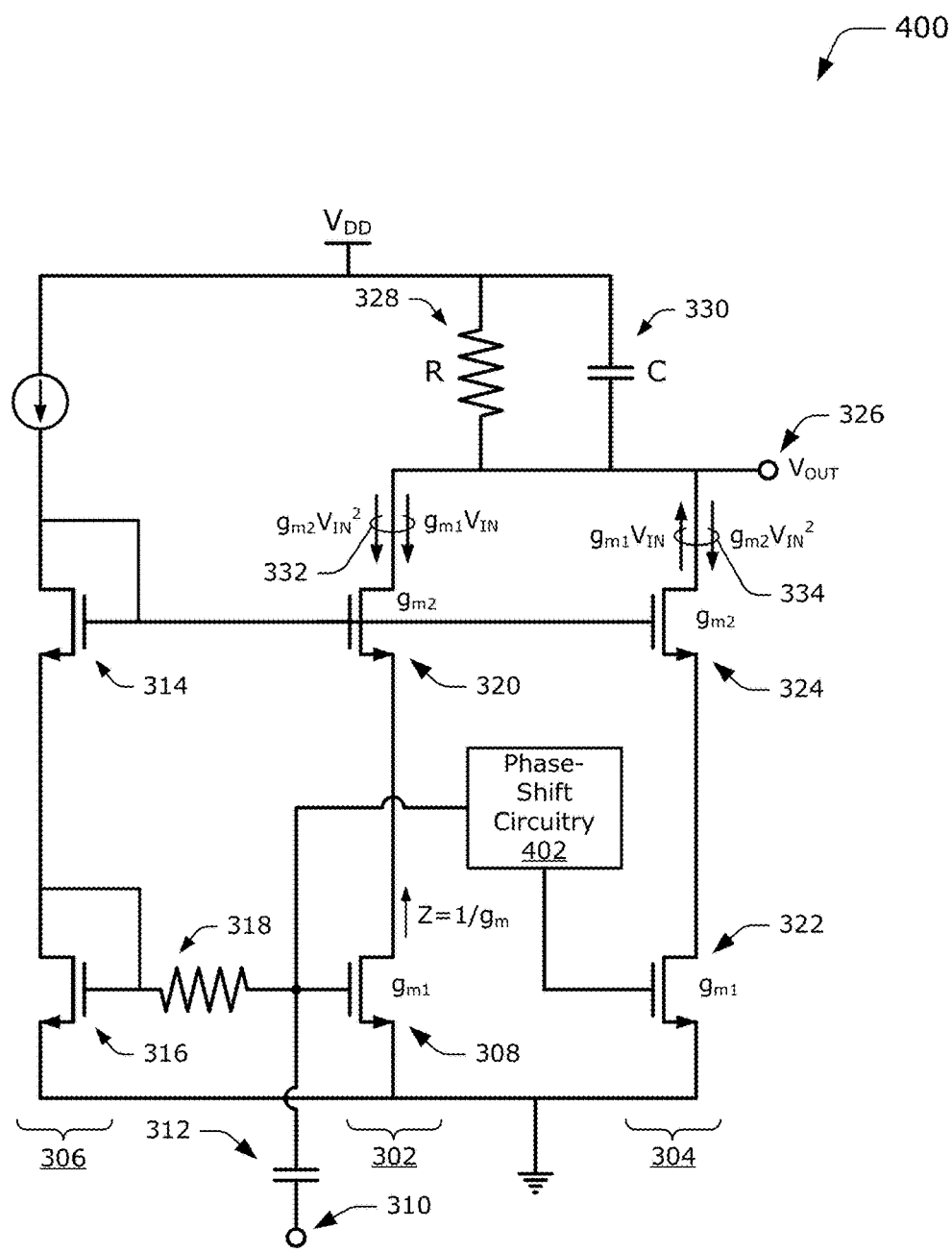
FIG. 4 illustrates an example circuit for implementing a fast settling peak detector with phase-shift circuitry.

As another example, consider FIG. 4 in which another fast settling peak detector circuit is shown generally at 400. For brevity, like components of the peak detector circuit 400 may be configured similar to corresponding components of the peak detector circuit 300 of FIG. 3a or 3b unless described otherwise. In this particular example, the peak detector circuit 400 includes phase-shift circuitry 402 that is coupled between an input 310 of the circuit and a gate of a third transistor 322 of a cancellation branch. In some cases, the phase-shift circuitry 402 is implemented as an alternate to the signal-inverting transistor 308 of FIG. 3a or the signal-inverting component 338 of FIG. 3b to provide a fast settling peak detector circuit.

In some aspects, the phase-shift circuitry 402 shifts or delays a phase of a signal received at the input 310. The phase of the signal may be shifted by approximately 180 degrees with respect to a phase of the signal received at the input 310 of the circuit. In some cases, shifting the phase of the signal by approximately 180 degrees or a multiple of 180 degrees is effective to provide a phase-shifted signal having an amplitude that is opposite to that of the signal received at the input 310 (e.g., non-inverted signal). The phase-shift circuitry 402 can then apply the phase-shifted signal to the gate of the third transistor 322 of the second pair of transistors 304. The phase-shift circuitry 402 can be implemented using any suitable type of component, such as an operational-amplifier, RC network, diode, switch-line transmission path, and the like. Alternately or additionally, the phase-shift circuitry 402 may receive operational power from a voltage rail (e.g., VDD) and be referenced to a lower potential, such as ground, to facilitate operation in the peak detector circuit 400.

As described with reference to FIG. 3a, signals applied to respective gates of the first transistor 308 and third transistor 322 can control respective current and other current that flows in the first pair of transistors 302 and second pair of transistors 304. Applying a signal to the gate of the first transistor 308 and a phase-shifted version of that signal to the gate of the third transistor 322 can be effective to cause a portion of the other current to flow in the second pair of transistors 304 in a direction opposite to the current flowing in the first pair of transistors 302.

With reference to FIG. 4, an example of current flow is shown with respect to first order and second order circuit gain provided by each of the first and second pairs of transistors. Similar to the current flow of FIGS. 3a and 3b, a portion of the current 334 flowing in the first pair of transistors 302 ($gm_1 V_{IN}$) flows in a direction opposite to another portion of the other current 334 flowing, responsive to the phase-shifted signal, in the second pair of transistors 304 ($gm_1V_{IN}$). This portion of the other current flowing in the opposite direction through the cancellation branch (e.g., pair of transistors 304) can cancel or reduce frequency components of the current flowing in the first pair of transistors 302. In particular, the other current in the cancellation branch may cancel non-squared frequency components of the current in the first transistor pair 302, such as a fundamental tone or fundamental frequency of an input signal. With the respective first order currents of the circuit 400 cancelling each other, the resulting circuit gain for the circuit 400 includes terms of second order circuit gain, which can also be expressed as shown in equation 1.

With a fundamental frequency component cancelled by the phase-shift-based cancellation branch, the DC or near-DC term component of the output signal can be provided with less filtering than traditional single-ended peak detectors. In some cases, the capacitance value is reduced by approximately half from a capacitance value employed by a conventional peak detector to filter or reject frequency harmonics (e.g., fundamental RF tone). Reducing the capacitance at the output of the circuit may also decrease a settling time of the peak detector circuit by approximately half compared to that of a conventional peak detector due to a corresponding reduction of an RC time constant of the filter. This can be effective to provide a fast settling peak detector circuit that is capable of operating with settling times of less than 100 nanoseconds. Here, note that VDD may also be configured to enable operation of the circuit 400 without a tail current source, and thus may be approximately 1.1 volts or lower. As such, the fast settling peak detector circuit 400 can be implemented with less voltage headroom than other circuit types, such as differential circuits that require a tail current source.

Techniques of Fast Settling Peak Detection

The following techniques of fast settling peak detection may be implemented using the previously described elements of the example environment, components, or circuits. Reference to elements, such as the peak detector 130, automatic gain control block 132, and variable gain amplifier 134, is made by example only and is not intended to limit the ways in which the techniques can be implemented.

The techniques are described with reference to example methods illustrated in FIGS. 5, 7, and 8, which are depicted as respective sets of operations or acts that may be performed by entities described herein. The operations described herein may be performed using any suitable circuitry or component, which may provide means for implementing one or more of the operations. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 5:
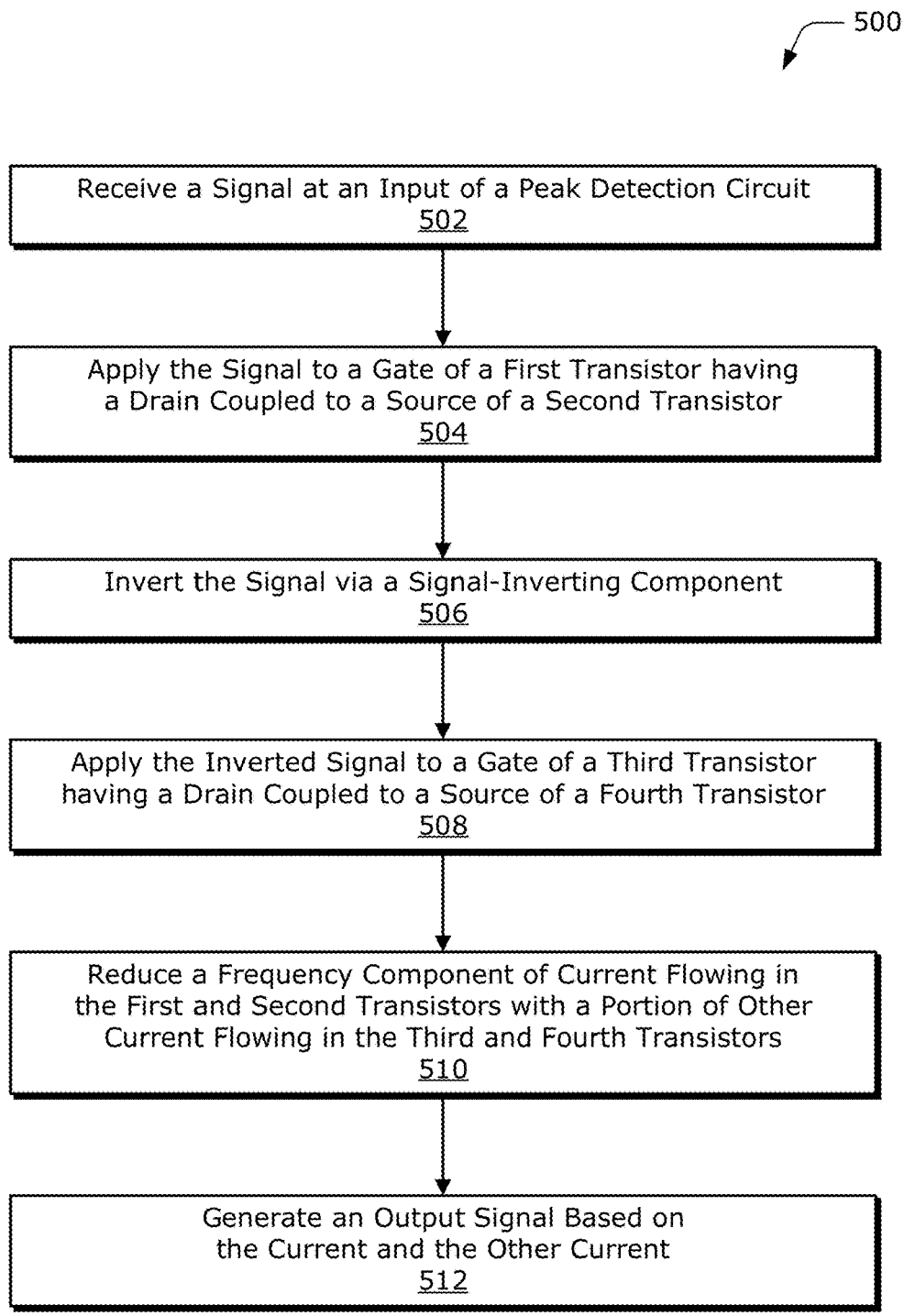
FIG. 5 illustrates an example method for fast settling peak detection that includes signal inversion.

FIG. 5 illustrates an example method 500 for fast settling peak detection that includes signal inversion, including operations performed by the fast settling peak detector 130.

At 502, an input (e.g., input 310) of a fast settling peak detector circuit (e.g., circuit 300) receives a signal (e.g., $V_{IN}$ or RF signal 202). The signal may be provided to the input of the fast settling peak detector circuit by an antenna, switch, filter, low-noise amplifier, or pre-amplifier, such as those implemented by an RF front end of a device capable of wireless communication (e.g., computing device 102). The RF signal may be any suitable type of signal, such as a cellular signal, WPAN, or WLAN signal having a frequency in a range of approximately 700 MHz to 5.8 GHz. In some cases, a capacitor coupled between the input and other components of the fast settling peak detector blocks lower frequency components (e.g., DC components) of the signal received at the input.

At 504, the input (e.g., input 310) of the fast settling peak detector circuit (e.g., circuit 300) applies the signal (e.g., $V_{IN}$ or RF signal 202) to a gate of a first transistor (e.g., transistor 308) having a drain coupled to a second transistor (e.g., 320) of the circuit. The signal applied to the gate of the first transistor can control an amount or amplitude of current that flows in the first and second transistors. For example, first and second order terms of current (e.g., $gm_1V_{IN}$, $gm_2V_{IN}^2$) may flow in the first and second transistors in response to the signal applied to the gate of the first transistor. In some cases, the gate of the first transistor is biased by bias circuitry (e.g., bias circuitry 306) of, or associated with, the fast settling peak detector circuit. In such cases, a resistor of the bias circuitry may be coupled to the gate of the first transistor of the circuit. Alternately or additionally, a gate of the third transistor may also be biased by the bias circuitry associated with the fast settling peak detector circuit.

At 506, a signal-inverting component (e.g., signal-inverting component 338 or transistor 308) of the fast settling peak detector circuit (e.g., circuit 300) inverts the signal (e.g., $V_{IN}$ or RF signal 202) to provide an inverted signal (e.g., inverted $V_{IN}$ or inverted RF signal 202). In some cases, the first transistor of the circuit is implemented as the signal-inverting component to provide the inverted signal. In such cases, the first transistor may provide the inverted signal or an approximate version thereof responsive to the signal applied to the gate of the first transistor. As such, generation of the inverted signal may be slightly delayed (e.g., non-simultaneous) or slightly out-of-phase with the signal due to response characteristics of the first transistor. Alternately, the circuit may include a separate component, such as another transistor or operational amplifier, to invert the signal to provide the inverted signal.

At 508, the signal-inverting component (e.g., signal-inverting component 338 or transistor 308) of the fast settling peak detector circuit (e.g., circuit 300) applies the inverted signal (e.g., inverted $V_{IN}$ or inverted RF signal 202) to a third transistor (e.g., transistor 322) having a drain coupled to a source of a fourth transistor (e.g., transistor 324) of the circuit. The inverted signal applied to the gate of the third transistor may control current flow in the third and fourth transistors. For example, first and second order current terms (e.g., $gm_1V_{IN}$, $gm_2V_{IN}^2$) may flow in the third and fourth transistors in response to application of the inverted signal to the gate of the third transistor.

At 510, a portion of the other current (e.g., current 334, $gm_1V_{IN}$) flowing in the third and fourth transistors (e.g., transistors 322 and 324) reduces (or cancels) a frequency component (e.g., a fundamental RF tone) of the current (e.g., current 332, $gm_1V_{IN}$) flowing in the first and second transistors (e.g., transistors 308 and 320). The portion of the other current flowing in the third and fourth transistors may reduce or cancel, with respect to an output node of the circuit (e.g., output 326), a fundamental frequency component or fundamental RF tone of the current flowing in the first and second transistors. In some cases, the portion of the other current in the third and fourth transistors and the fundamental frequency component of the first and second transistors are first order terms of current that cancel each other out with respect to the output node of the circuit. In such cases, remaining current flowing in the first and second transistors and other current flowing in the third and fourth transistors comprises second order current terms (e.g., $gm_2V_{IN}^2$) that flow with respect to the output node of the circuit. The fast settling peak detector circuit can use these second order terms of current to generate, at the output node of the circuit, a DC or near-DC signal that indicates a peak amplitude of the signal received at the input of the circuit.

Figure 6:
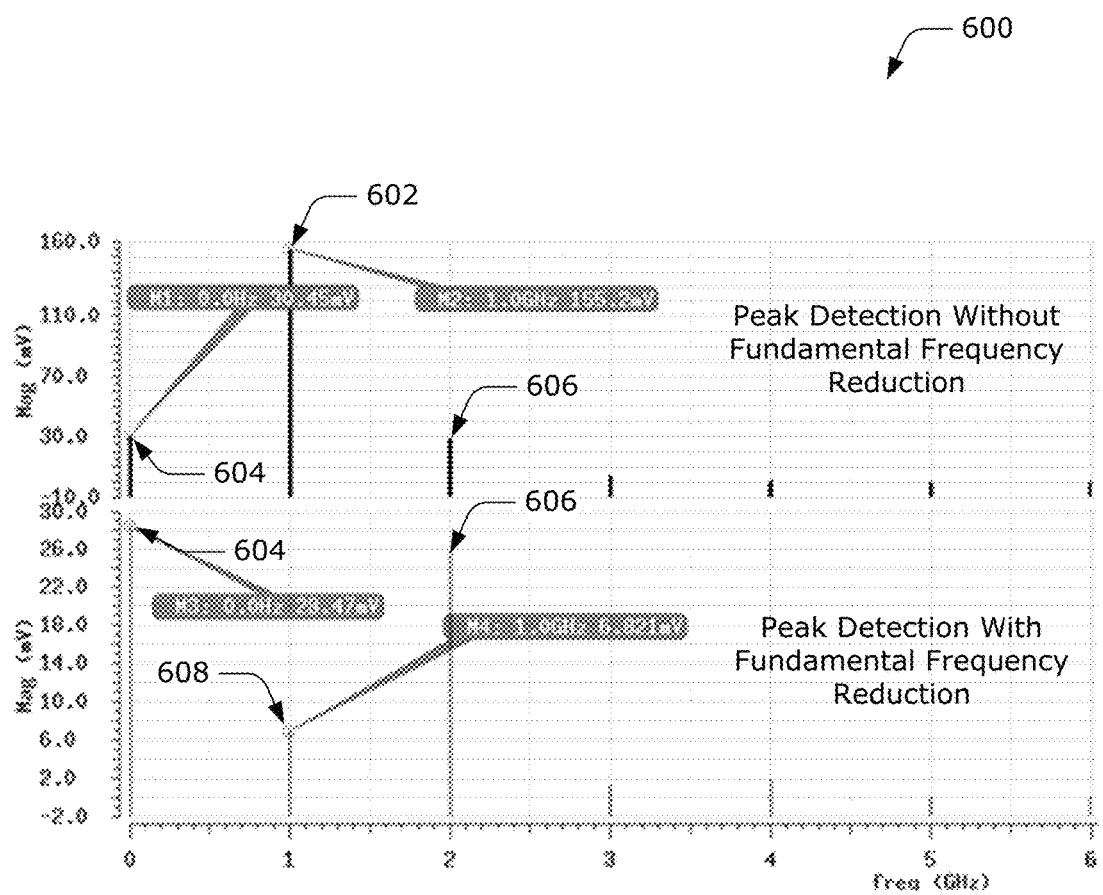
FIG. 6 illustrates example spectral components of RF signals detected in accordance with one or more aspects.

By way of example, consider FIG. 6, which includes spectral graphs 600 of a peak detector circuit output signal with and without fundamental frequency reduction. Without the reduction of a fundamental frequency component 602 (top graph), an amplitude of the fundamental frequency 602 (e.g., 155 mV) is approximately five times greater than a DC term 604 (e.g., desired output signal component, 30 mV) that indicates a peak amplitude of a signal received by the peak detector circuit. In such a case, a low-pass filter is typically implemented to reject the fundamental frequency component 602 and a second harmonic component 606 from the output signal of the peak detector circuit. Thus, a cutoff frequency of the low-pass filter must be configured for a frequency below that of the fundamental frequency, which results in a large filter RC time constant that increases settling times of the peak detector.

In contrast to peak detection without fundamental frequency reduction, aspects of a fast settling peak detector enable peak detection with reduction (or cancellation) of the fundamental frequency component 602 (bottom graph, reduced voltage scale). By using a portion of current flowing in a cancellation branch (e.g., transistors 322 and 324), a fast settling peak detector circuit can reduce or cancel the fundamental frequency component 602 to provide a reduced (or modified) fundamental frequency component 608, which has an amplitude (e.g., 7 mV) less than the DC term 604 that indicates the peak amplitude of the signal received by the peak detector circuit. This may preclude the need to filter for the fundamental frequency component and permit a cutoff frequency of a low-pass filter to be shifted higher to reject the second harmonic 606. Increasing the cutoff frequency of the low-pass filter includes reducing an amount of capacitance of the filter, which results in a smaller filter RC time constant that decreases settling times of the peak detector. In some cases, settling times of a fast settling peak detector are approximately half of a settling time of a traditional single-ended peak detector.

At 512, the fast settling peak detector circuit (e.g., circuit 300) generates an output signal (e.g., $V_{OUT}$) based on the current (e.g., current 332, $gm_2V_{IN}^2$) flowing in the first and second transistors (e.g., transistors 308 and 320) and the other current (e.g., current 334, $gm_2V_{IN}^2$) flowing in the third and fourth transistors (e.g., transistors 322 and 324). The output signal may be generated as a substantially DC term that indicates an amplitude of the signal received at the input of the fast settling peak detector circuit. With the fundamental frequency component reduced or cancelled, the output signal may be filtered for higher frequency harmonics, such as a second harmonic component having a frequency approximately twice that of the fundamental frequency component.

Figure 7:
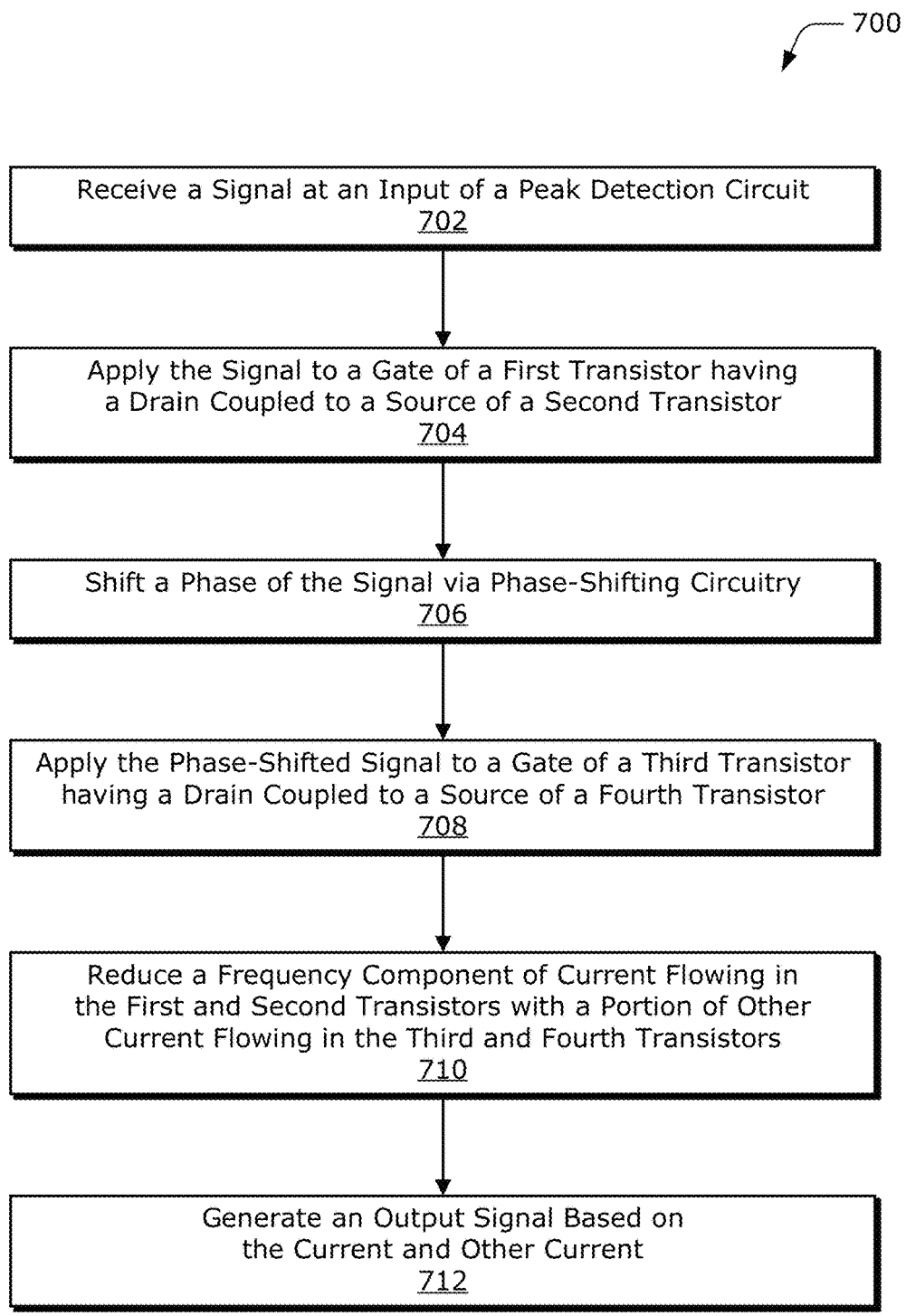
FIG. 7 illustrates an example method for fast settling peak detection that includes phase-shifting.

FIG. 7 illustrates an example method 700 for fast settling peak detection that includes phase-shifting, including operations performed by the fast settling peak detector 130.

At 702, an input (e.g., input 310) of a fast settling peak detector circuit (e.g., circuit 400) receives a signal (e.g., $V_{IN}$ or RF signal 202). The signal may be provided to the input of the fast settling peak detector circuit by an antenna, switch, filter, low-noise amplifier, or pre-amplifier, such as those implemented by an RF front end of a device capable of wireless communication (e.g., computing device 102). The RF signal may be any suitable type of signal, such as a cellular signal, WPAN, or WLAN signal having a frequency in a range of approximately 700 MHz to 5.8 GHz. In some cases, a capacitor coupled between the input and other components of the fast settling peak detector blocks lower frequency components (e.g., DC components) of the signal received at the input.

At 704, the input (e.g., input 310) of the fast settling peak detector circuit (e.g., circuit 400) applies the signal (e.g., $V_{IN}$ or RF signal 202) to a gate of a first transistor (e.g., transistor 308) having a drain coupled to a second transistor (e.g., 320) of the circuit. The signal applied to the gate of the first transistor can control an amount or amplitude of current that flows in the first and second transistors. For example, first and second order terms of current (e.g., $gm_1V_{IN}$, $gm_2V_{IN}^2$) may flow in the first and second transistors in response to the signal applied to the gate of the first transistor. In some cases, the gate of the first transistor is biased by bias circuitry of, or associated with, the fast settling peak detector circuit. In such cases, a resistor of the bias circuitry may be coupled to the gate of the first transistor of the circuit. Alternately or additionally, a gate of the third transistor may also be biased by the bias circuitry of the fast settling peak detector circuit.

At 706, phase-shift circuitry (e.g., phase-shift circuitry 402) of the fast settling peak detector circuit (e.g., circuit 400) shifts a phase of the signal (e.g., $V_{IN}$ or RF signal 202) to provide a phase-shifted signal (e.g., phase-shifted $V_{IN}$ or phase-shifted RF signal 202). The phase-shift circuitry may be implemented using any suitable components or circuitry, such as an operational amplifier, RC networks, diodes, and the like. In some cases, the phase of the signal is shifted by approximately 180 degrees (or a multiple thereof) to provide the phase-shifted signal. The phase-shifted signal may approximate an inverted, though delayed, version of the signal received at the input of the circuit.

At 708, the phase-shift circuitry (e.g., phase-shift circuitry 402) of the fast settling peak detector circuit (e.g., circuit 400) applies the phase-shifted signal (e.g., phase-shifted $V_{IN}$ or phase-shifted RF signal 202) to a third transistor (e.g., transistor 322) having a drain coupled to a source of a fourth transistor (e.g., transistor 324) of the circuit. The phase-shifted signal applied to the gate of the third transistor may control current flow in the third and fourth transistors. For example, first and second order current terms (e.g., $gm_1V_{IN}$, $gm_2V_{IN}^2$) may flow in the third and fourth transistors in response to application of the phase-shifted signal to the gate of the third transistor.

At 710, a portion of the other current (e.g., current 334, $gm_1V_{IN}$) flowing in the third and fourth transistors (e.g., transistors 322 and 324) reduces (or cancels) a frequency component (e.g., a fundamental RF tone) of the current (e.g., current 332, $gm_1V_{IN}$) flowing in the first and second transistors (e.g., transistors 308 and 320). The portion of the other current flowing in the third and fourth transistors may reduce or cancel a fundamental frequency component or fundamental RF tone of the current flowing in the first and second transistors.

In some cases, the portion of the other current of the third and fourth transistors and the fundamental frequency component of the first and second transistors are first order terms of current that cancel each other out. In such cases, remaining current flowing in the first and second transistors and the other current flowing in the third and fourth transistors, respectively, comprise second order current terms (e.g., $gm_2V_{IN}^2$) that flow in relation to an output of the circuit. The fast settling peak detector circuit can use these second order terms of current to generate, at the output node of the circuit, a DC or near-DC signal that indicates a peak amplitude of the signal received at the input of the circuit.

At 712, the fast settling peak detector circuit (e.g., circuit 400) generates an output signal (e.g., $V_{OUT}$) based on the current (e.g., current 332, $gm_2 V_{IN}^2$) flowing in the first and second transistors (e.g., transistors 308 and 320) and the other current (e.g., current 334, $gm_2 V_{IN}^2$) flowing in the third and fourth transistors (e.g., transistors 322 and 324). The output signal may be generated as a substantially DC term that indicates an amplitude of the signal received at the input of the fast settling peak detector circuit. With the fundamental frequency component cancelled, the output signal may be filtered for higher frequency harmonics, such as a second harmonic component having a frequency approximately twice that of the fundamental frequency component.

Figure 8:
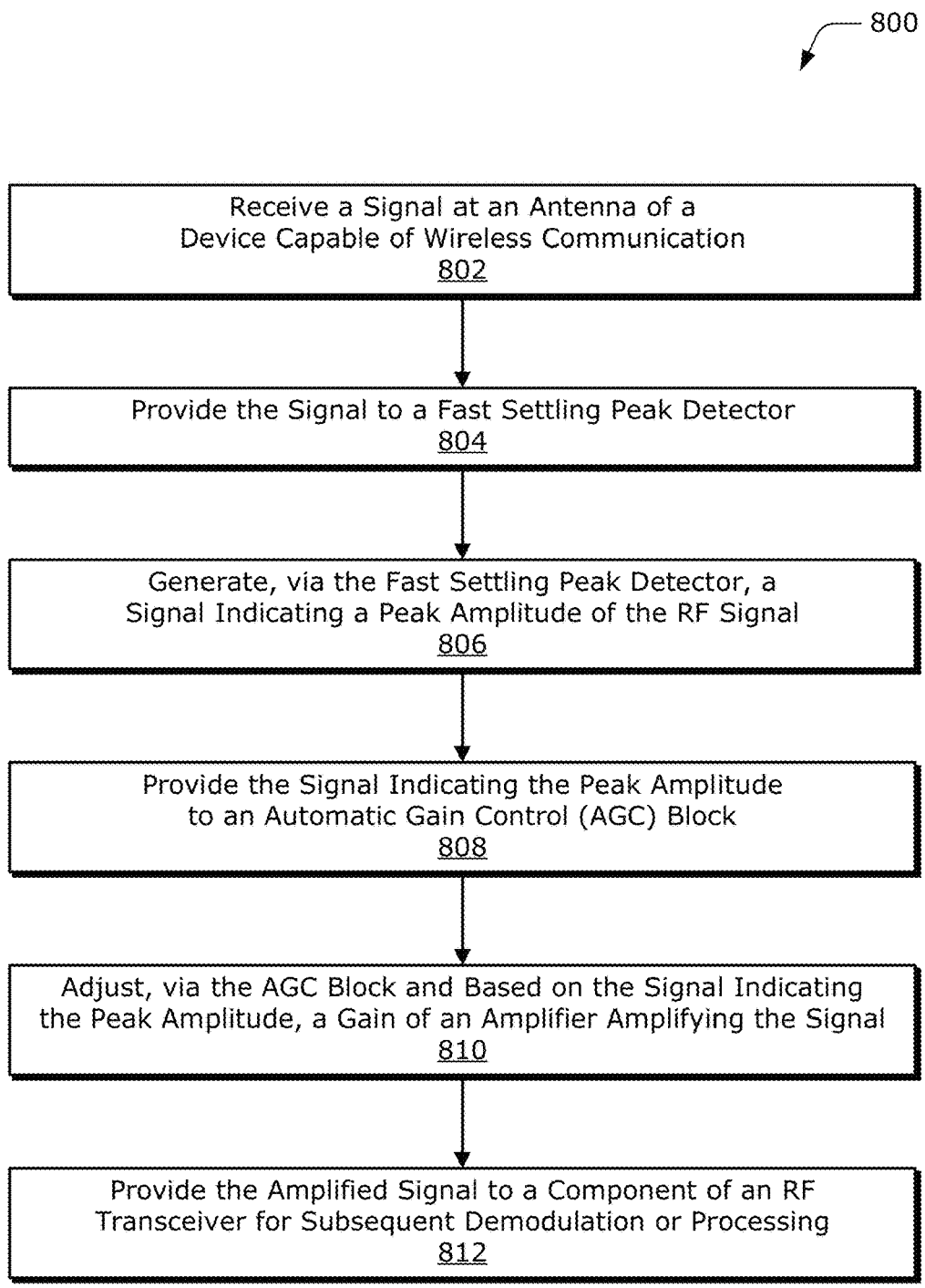
FIG. 8 illustrates an example method for automatic gain control with a fast settling peak detector.

FIG. 8 illustrates an example method 800 for automatic gain control with a fast settling peak detector, including operations performed by the fast settling peak detector 130 and AGC block 132.

At 802, an antenna (e.g., antennas 128) of a device capable of wireless communication (e.g., computing device 102) receives an RF signal (e.g., RF signal 202). The RF signal may include any suitable type of signal, such as a cellular network signal transmitted by a base station, a WLAN signal transmitted by an access point, or a WPAN signal transmitted by a peer device. Alternately or additionally, a frequency of the RF signal may be within a range of approximately 700 MHz to 60 GHz.

At 804, the antenna (e.g., antennas 128) provides the RF signal (e.g., RF signal 202) to a fast settling peak detector (e.g., peak detector 130) of the device. In some cases, the antenna or a transmit path provides the RF signal to the fast settling peak detector through a pin or contact of an integrated circuit chip in which the detector is embodied. In such cases, the signal may be provided through a single pin as a non-differential signal, which may enable an RF pin count of the integrated circuit chip to be reduced from two pins that are required for differential signals. Prior to reaching the fast settling peak detector, the RF signal may pass through other components of an RF front end, such as a filter, switch, pre-amplifier, DC blocking capacitor, and the like.

At 806, the fast settling peak detector (e.g., peak detector 130) generates a signal (e.g., output signal 604) that indicates a peak amplitude of the RF signal (e.g., RF signal 202). The fast settling peak detector may generate the signal by cancelling spectral components of a fundamental frequency of the RF signal, such as by implementing a cancellation branch or cancellation path that includes aspects of signal inversion or phase-shifting. By so doing, a value of the peak detector's filtering capacitor can be reduced (e.g., to between 20 femtofarads to 80 femtofarads) from a capacitance value typically used to filter out the fundamental frequency of the RF signal. This may result in a settling time of the peak detector being approximately 100 nanoseconds or less, which may in turn enable faster AGC applications or algorithms.

At 808, the fast settling peak detector (e.g., peak detector 130) provides the signal (e.g., output signal 604) indicating the peak amplitude of the RF signal (e.g., RF signal 202) to an AGC block (e.g., AGC block 132) of the device. In some cases, the fast settling peak detector and AGC block are embodied in a wireless transceiver chip of the device. The AGC block may be configured to set or adjust gain of one or more amplifiers in a receive chain through which the RF signal passes. Alternately or additionally, the fast settling peak detector may provide the signal indicating the peak amplitude of the RF signal to other entities of a wireless transceiver, such as an analog-to-digital convertor or a digital-signal processor (DSP).

At 810, the automatic gain control block (e.g., AGC block 132) adjusts, based on the signal (e.g., output signal 604) indicating the peak amplitude of the RF signal, a gain of an amplifier (e.g., VGA 134) amplifying the RF signal (e.g., RF signal 202). In some cases, the gain of the amplifier is increased in response to an amplitude of the RF signal falling. In other cases, the gain of the amplifier may be decreased to prevent overloading of a downstream transceiver. Because the output signal of the fast settling peak detector settles quicker than traditional single-ended peak detectors, the AGC block may be able to set or adjust the gain of the amplifiers more rapidly than with other types of detectors.

At 812, the amplifier (e.g., VGA 134) provides the amplified RF signal (e.g., amplified RF signal 202) to a component of an RF transceiver (e.g., RF transceiver 124) of the device for subsequent demodulation or processing. The component of the RF transceiver (or receiver) may include a filter, amplifier, mixer, demodulator, and the like. The RF transceiver may further condition and demodulate the RF signal and provide the demodulated signal to a baseband modem of the device. The baseband modem can then convert or sample the demodulated signal to extract data or control information that is useful to the device.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A peak detector circuit comprising:
   a first transistor having a gate coupled to an input of the circuit and a drain coupled to a source of a second transistor;
   a third transistor having a gate coupled, via a signal-inverting component that comprises the first transistor, to the input of the circuit and a drain coupled to a source of a fourth transistor, the gate of the third transistor coupled to the drain of the first transistor;
   a bias circuit coupled to the gate of the first transistor; and
   a resistor coupled from a voltage rail to an output of the circuit, the output of the circuit including a node to which respective drains of the second and fourth transistors are coupled.

2. The peak detector circuit as recited in claim 1, further comprising a capacitor coupled between the voltage rail and the output of the circuit.

3. The peak detector circuit as recited in claim 2, wherein a capacitance of the capacitor is between 40 femtofarads and 90 femtofarads.

4. The peak detector circuit as recited in claim 3, wherein the capacitance of the capacitor is effective to enable, at the output of the circuit, a settling time of approximately 100 nanoseconds or less.

5. The peak detector circuit as recited in claim 1, wherein the resistor is a first resistor and the bias circuit comprises:
   a second resistor; and
   a current mirror that includes a transistor having a drain and a gate coupled, via the second resistor, to the gate of the first transistor.

6. The peak detector circuit as recited in claim 1, wherein the gate of the first transistor is coupled to the input of the circuit via a capacitor.

7. The peak detector circuit as recited in claim 1, wherein a gate of the second transistor is coupled to a gate of the fourth transistor.

8. The peak detector circuit as recited in claim 1, wherein a resistance of the resistor is between 75 ohms and 125 ohms.

9. The peak detector circuit as recited in claim 1, wherein the peak detector circuit is implemented as a single-ended peak detector circuit.

10. A method of operating a circuit, the method comprising:
receiving a signal at an input of the circuit;
applying the signal to a gate of a first transistor having a drain coupled to a source of a second transistor, a drain of the second transistor coupled to an output of the circuit;
inverting, via the first transistor, the signal to provide an inverted signal, the first transistor comprising a signal-inverting component of the circuit, the drain of the first transistor coupled to a gate of a third transistor;
applying the inverted signal to the gate of the third transistor having a drain coupled to a source of a fourth transistor, a drain of the fourth transistor coupled to an output of the circuit;
reducing a frequency component of current flowing in the first and second transistors with other current flowing in the third and fourth transistors based on the inverted signal; and
providing, at the output of the circuit, an output signal based on the current flowing in the first and second transistors and the other current flowing in the third and fourth transistors.

11. The method as recited in claim 10, wherein the reduced frequency component is a fundamental frequency component of the signal.

12. The method as recited in claim 10, wherein the output signal indicates a magnitude of the signal received at the input of the circuit.

13. The method as recited in claim 10, wherein the reducing the frequency component of the current flowing in the first and second transistors comprises causing a portion of the other current that is associated with the frequency component to flow through the third and fourth transistors in a direction opposite to that of the current flowing in the first and second transistors.

14. The method as recited in claim 10, further comprising biasing the first transistor with a bias circuit coupled to the gate of the first transistor.

15. The method as recited in claim 10, further comprising filtering the output signal with a capacitor coupled from a voltage rail to the output of the circuit.

16. The method as recited in claim 15, wherein a capacitance of the capacitor is between 40 femtofarads and 90 femtofarads.

17. The method as recited in claim 10, further comprising blocking direct current (DC) frequency components of the signal with a capacitor coupled between the input of the circuit and the gate of the first transistor.

18. A circuit for peak detection comprising:
an input configured to receive a signal;
a first pair of transistors in which current flows responsive to the signal, the first pair of transistors including a first transistor and a second transistor, the first transistor having a gate coupled to the input and a drain coupled to a source of the second transistor;
signal inversion means for providing, based on the signal, an inverted signal, the signal inversion means comprising the first transistor;
a second pair of transistors in which other current flows responsive to the inverted signal, the second pair of transistors including a third transistor and a fourth transistor, the third transistor having a gate coupled, via the signal inversion means, to the input of the circuit and a drain coupled to a source of the fourth transistor, the gate of the third transistor coupled to the drain of the first transistor;
means for reducing a frequency component of the current with a portion of the other current; and
an output configured to generate an output signal based on the current flowing in the first pair of transistors and the other current flowing in the second pair of transistors.

19. The circuit for peak detection as recited in claim 18, wherein the first pair of transistors and the second pair of transistors are implemented as respective cascode amplifiers.

20. The circuit for peak detection as recited in claim 18, further comprising biasing means coupled to the first pair of transistors.

21. A circuit for peak detection comprising:
an input configured to receive a signal;
a first transistor having a gate coupled to the input of the circuit;
a second transistor having a source coupled to a drain of the first transistor;
a third transistor having a gate coupled to the drain of the first transistor;
a fourth transistor having a source coupled to a drain of the third transistor;
a bias circuit coupled to the gate of the first transistor; and
an output that includes a node to which respective drains of the second and fourth transistors are coupled, the output of the circuit coupled to a voltage rail via a resistor.

22. The circuit for peak detection as recited in claim 21, further comprising a capacitor coupled between the voltage rail and the output of the circuit.

23. The circuit for peak detection as recited in claim 22, wherein a capacitance of the capacitor is between 40 femtofarads and 90 femtofarads.

24. The circuit for peak detection as recited in claim 23, wherein the capacitance of the capacitor is effective to enable, at the output of the circuit, a settling time of approximately 100 nanoseconds or less.

25. The circuit for peak detection as recited in claim 21, wherein the resistor is a first resistor and the bias circuit comprises:
a second resistor; and
a current mirror that includes a fifth transistor having a drain and a gate coupled, via the second resistor, to the gate of the first transistor.

26. The circuit for peak detection as recited in claim 21, wherein the gate of the first transistor is coupled to the input of the circuit via a capacitor.

27. The circuit for peak detection as recited in claim 21, wherein a gate of the second transistor is coupled to a gate of the fourth transistor.

28. The circuit for peak detection as recited in claim 21, wherein a resistance of the resistor is between 75 ohms and 125 ohms.

29. The circuit for peak detection as recited in claim 21, wherein the circuit for peak detection is implemented as a single-ended circuit.

\* \* \* \* \*